(12) United States Patent
Okumura et al.

(10) Patent No.: US 7,693,671 B2
(45) Date of Patent: Apr. 6, 2010

(54) BATTERY CONTROL DEVICE, BATTERY CONTROL METHOD, BATTERY PACK, ELECTRONIC APPARATUS AND CONTROL CIRCUIT FOR CALCULATING CHARGING-DISCHARGING COUNT OF BATTERY

(75) Inventors: Masafumi Okumura, Kawasaki (JP); Hideo Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 189 days.

(21) Appl. No.: 11/858,303

(22) Filed: Sep. 20, 2007

(65) Prior Publication Data

US 2008/0120049 A1   May 22, 2008

(30) Foreign Application Priority Data

Nov. 17, 2006   (JP) .............................. 2006-312046

(51) Int. Cl.
*H02J 7/00* (2006.01)
*G06F 17/40* (2006.01)

(52) U.S. Cl. .............................. 702/63; 702/64; 702/60; 320/132; 320/137; 320/149

(58) Field of Classification Search ................... 702/63, 702/64, 60
See application file for complete search history.

(56) References Cited

U.S. PATENT DOCUMENTS

| | | | |
|---|---|---|---|
| 5,525,890 A | 6/1996 | Iwatsu et al. .................. 320/14 |
| 5,744,963 A * | 4/1998 | Arai et al. ................... 324/427 |
| 6,512,984 B1 | 1/2003 | Suzuki et al. .................. 702/63 |
| 6,587,799 B2 | 7/2003 | Suzuki et al. .................. 702/63 |
| 6,661,231 B1 * | 12/2003 | Arai et al. .................... 324/426 |
| 2002/0105303 A1 * | 8/2002 | Kishi et al. .................. 320/134 |
| 2002/0169572 A1 | 11/2002 | Suzuki et al. .................. 702/99 |
| 2005/0024020 A1 | 2/2005 | Hogari et al. ............... 320/132 |
| 2005/0046389 A1 * | 3/2005 | Kim ........................... 320/132 |
| 2008/0054909 A1 * | 3/2008 | Fukuda ....................... 324/429 |

FOREIGN PATENT DOCUMENTS

| | | |
|---|---|---|
| EP | 0 583 906 | 2/1994 |
| EP | 1 037 064 | 9/2000 |
| EP | 1 503 219 | 2/2005 |
| JP | 6-68912 | 3/1994 |
| JP | 11-233152 | 8/1999 |
| JP | 11-233153 | 8/1999 |
| JP | 11-233161 | 8/1999 |
| JP | 2000-195564 | 7/2000 |
| JP | 2000-260486 | 9/2000 |
| JP | 2005-49216 | 2/2005 |

* cited by examiner

*Primary Examiner*—Hal D Wachsman

(57) ABSTRACT

A battery control device includes a unit to measure a voltage of a battery, a unit to measure an electric current of the battery, and a control unit to calculate an open-circuit voltage of the battery based on the voltage and the electric current of the battery, and to calculate a battery residual quantity ratio of the battery by use of relative information and the calculated open-circuit voltage, wherein the control unit calculates a charge quantity ratio of the battery by subtracting a battery residual quantity ratio at charge ending time from a battery residual quantity ratio at charge starting time, calculates a value obtained by multiplying the charge quantity ratio by a correction coefficient as a charging-discharging count of the battery, and integrates the charging-discharging count each time the charging-discharging count is calculated.

29 Claims, 9 Drawing Sheets

BATTERY CONTROL DEVICE, BATTERY CONTROL METHOD, BATTERY PACK, ELECTRONIC APPARATUS AND CONTROL CIRCUIT FOR CALCULATING CHARGING-DISCHARGING COUNT OF BATTERY

This application claims the benefit of Japanese Patent Application No. 2006-312046 filed Nov. 17, 2006 in the Japanese Patent Office, the disclosure of which is herein incorporated in its entirety by reference.

BACKGROUND OF DISCLOSURE

The disclosure relates to a battery control device, a battery control method, a battery pack, an electronic apparatus, a battery control program and a control circuit.

A secondary battery gradually decreases in dischargeable battery capacity (discharge capacity) as charge/discharge is repeated. In a recent lithium ion battery, the discharge capacity decreases down to approximately 60% as the charge/discharge is repeated 300 through 500 times. Therefore, a charging/discharging count is one of indexes indicating a deteriorated state of the battery. In information equipment such as a personal computer and a PDA (Personal Digital Assistant), however, it is a general practice that the battery is charged with electricity without discharging the electricity to the end in order to avoid a loss of data. As a result, there must be a discrepancy from an actual value depending of how a charging/discharging count is counted. There is a method of counting one when integrating the electric current and if a fixed quantity of electricity is discharged, and also counting one when an integrated charge current quantity reaches a specified value. Another method is that a voltage at charge starting time and a voltage at charge ending time are converted into the charging/discharging count. Still another method is that the discharge capacity is integrated and then converted into the charging/discharging count.

SUMMARY OF DISCLOSURE

The method of converting the voltage at the charge starting time and the voltage at the charge ending time into the charging/discharging count, does not take account of a discharge condition such as a discharge rate with respect to the battery voltage when charged with the electricity. Further, the discharge capacity and also the charging/discharging count differ depending on the discharge condition. The method of integrating and converting the discharge capacity into the charging/discharging count, requires knowing a full-charge capacity for converting the integrated value into the charging/discharging count, however, if the full-charge capacity remained fixed, it is impossible to properly make the conversion about the battery of which the capacity decreases due to the deterioration.

The present disclosure aims at calculating the charging/discharging count even without performing the full-charge or the complete discharge. Further, the present disclosure aims at calculating the charging/discharging count converted by use of the correction coefficient corresponding to the deterioration of the battery.

The present disclosure adopts the following means in order to solve the problems. Namely, in one aspect, a battery control device according to the present disclosure comprises: a voltage measuring unit measuring a voltage of a battery; a current measuring unit measuring an electric current of the battery; and a power source control unit calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control unit calculates a charge quantity ratio of the battery by subtracting a battery residual quantity ratio of the battery at charge ending time from a battery residual quantity ratio of the battery at charge starting time, calculates a value obtained in a way that multiplies the charge quantity ratio by a correction coefficient as a charging/discharging count of the battery, and integrates the charging/discharging count each time the charging/discharging count is calculated.

According to the battery control device of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the battery control device of the present disclosure, even when the battery at the charge starting time is not in the complete discharge state, the charging/discharging count of the battery can be calculated. Further, according to the battery control device of the present disclosure, even when the battery at the charge ending time is not in the full-charge state, the charging/discharging count of the battery can be calculated.

In another aspect, a battery control method according to the present disclosure comprises: a voltage measuring step of measuring a voltage of a battery; a current measuring step of measuring an electric current of the battery; and a power source control step of calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control step includes calculating a charge quantity ratio of the battery by subtracting a battery residual quantity ratio of the battery at charge ending time from a battery residual quantity ratio of the battery at charge starting time, calculating a value obtained in a way that multiplies the charge quantity ratio by a correction coefficient as a charging/discharging count of the battery, and integrating the charging/discharging count each time the charging/discharging count is calculated.

According to the battery control method of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the battery control method of the present disclosure, even when the battery at the charge starting time is not in the complete discharge state, the charging/discharging count of the battery can be calculated. Further, according to the battery control method of the present disclosure, even when the battery at the charge ending time is not in the full-charge state, the charging/discharging count of the battery can be calculated.

In another aspect, a battery pack according to the present disclosure comprises: a voltage measuring unit measuring a voltage of a battery; a current measuring unit measuring an electric current of the battery; and a power source control unit calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control unit calculates a charge quantity ratio of the battery by subtracting a battery residual quantity ratio of the battery at charge ending time from a battery residual quantity ratio of the battery at charge starting time, calculates a value obtained in a way that multiplies the charge quantity ratio by a correction coefficient as a charging/discharging count of the battery, and integrates the charging/discharging count each time the charging/discharging count is calculated.

According to the battery pack of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the battery pack of the present disclosure, even when the battery at the charge starting time is not in the complete discharge state, the charging/discharging count of the battery can be calculated. Further, according to the battery pack of the present disclosure, even when the battery at the charge ending time is not in the full-charge state, the charging/discharging count of the battery can be calculated.

In another aspect, according to the present disclosure, an electronic apparatus driving a load by electric power supplied from a battery, comprises: a voltage measuring unit measuring a voltage of a battery; a current measuring unit measuring an electric current of the battery; and a power source control unit calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control unit calculates a charge quantity ratio of the battery by subtracting a battery residual quantity ratio of the battery at charge ending time from a battery residual quantity ratio of the battery at charge starting time, calculates a value obtained in a way that multiplies the charge quantity ratio by a correction coefficient as a charging/discharging count of the battery, and integrates the charging/discharging count each time the charging/discharging count is calculated.

According to the electronic apparatus of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the electronic apparatus of the present disclosure, even when the battery at the charge starting time is not in the complete discharge state, the charging/discharging count of the battery can be calculated. Further, according to the electronic apparatus of the present disclosure, even when the battery at the charge ending time is not in the full-charge state, the charging/discharging count of the battery can be calculated.

In another aspect, according to the electronic apparatus of the present disclosure, the power source control unit calculates a charge quantity ratio of the battery by subtracting a battery residual quantity ratio of the battery at discharge ending time from a battery residual quantity ratio of the battery at discharge starting time, calculates a value obtained in a way that multiplies the charge quantity ratio by a correction coefficient as a charging/discharging count of the battery, and integrates the charging/discharging count each time the charging/discharging count is calculated.

According to the electronic apparatus of the present disclosure, the charge quantity ratio of the battery is calculated by subtracting the battery residual quantity ratio at the discharge ending time from the battery residual quantity ratio of the battery at the discharge starting time, thereby calculating the charging/discharging count of the battery. As a result, according to the electronic apparatus of the present disclosure, even when the battery at the discharge starting time is not in the full-charge state, the charging/discharging count of the battery can be calculated. Further, according to the electronic apparatus of the present disclosure, even when the battery at the discharge ending time is not in the complete discharge state, the charging/discharging count of the battery can be calculated.

In another aspect, according to the electronic apparatus of the present disclosure, the power source control unit, if the charging/discharging count exceeds a predetermined value, calculates the predetermined value as the charging/discharging count and, if the charging/discharging count does not exceed the predetermined value, calculates, as the charging/discharging count, a value obtained by multiplying the charge quantity ratio by the correction coefficient. According to the electronic apparatus of the present disclosure, the charging/discharging count not exceeding the predetermined value can be calculated.

Further, in another aspect, according to the electronic apparatus of the present disclosure, the correction coefficient is a value calculated based on the discharge capacity of the battery, which decreases due to deterioration of the battery. According to the electronic apparatus of the present disclosure, the charging/discharging count of the battery, which takes the deterioration of the battery into consideration, can be calculated.

Moreover, in another aspect, according to the electronic apparatus of the present disclosure, the battery includes a recording unit, and the power source control unit records the integrated charging/discharging count in the recording unit. According to the electronic apparatus of the present disclosure, the integrated charging/discharging count of the battery can be recorded in the recording unit provided in the battery.

Still further, in another aspect, a battery control program of the present disclosure, making a battery control device execute: a voltage measuring step of measuring a voltage of a battery; a current measuring step of measuring an electric current of the battery; and a power source control step of calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the battery control step includes calculating a charge quantity ratio of the battery by subtracting a battery residual quantity ratio at charge ending time from a battery residual quantity ratio of the battery at charge starting time, calculating a value obtained in a way that multiplies the charge quantity ratio by a correction coefficient as a charging/discharging count of the battery, and integrating the charging/discharging count each time the charging/discharging count is calculated.

According to the battery control program of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the battery control program of the present disclosure, even when the battery at the charge starting time is not in the complete discharge state, the charging/discharging count of the battery can be calculated. Further, according to the battery control program of the present disclosure, even when the battery at the charge ending time is not in the full-charge state, the charging/discharging count of the battery can be calculated.

Yet further, in another aspect, a control circuit according to the present disclosure is a circuit of a battery control device including a voltage measuring unit measuring a voltage of a battery and a current measuring unit measuring an electric current of the battery, and controlling a charging/discharging count of the battery, the control circuit comprising: a power source control unit calculating an open-circuit voltage of the battery based on the measured voltage of the battery and the measured electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control unit calculates a charge quantity ratio of the battery by subtracting a battery residual quantity ratio of the battery at charge ending time from a battery residual quantity ratio of the battery at charge starting time, calculates a value obtained in a way that multiplies the charge quantity ratio by a correction coefficient as a charging/discharging count of the battery, and integrates the charging/discharging count each time the charging/discharging count is calculated.

According to the control circuit of the present disclosure, the charge quantity ratio of the battery is calculated by subtracting the battery residual quantity ratio at the charge ending time from the battery residual quantity ratio of the battery at the charge starting time, thereby calculating the charging/discharging count of the battery. As a result, according to the control circuit of the present disclosure, even when the battery at the charge starting time is not in the complete discharge state, the charging/discharging count of the battery can be calculated. Further, according to the control circuit of the present disclosure, even when the battery at the charge ending time is not in the full-charge state, the charging/discharging count of the battery can be calculated.

Further, the present disclosure may also be a method by which a computer, other devices, machines, etc execute any one of the processes. Still further, the present disclosure may also be a program making the computer, other devices, machines, etc actualize any one of the functions. Yet further, the present disclosure may also be a recording medium recorded with such a program that can be read by the computer etc.

According to the present disclosure, it is possible to calculate the charging/discharging count even without performing the full-charge or the complete discharge. Further, it is feasible to calculate the charging/discharging count converted by use of the correction coefficient corresponding to the deterioration of the battery.

DETAILED DESCRIPTION

Embodiments of the present disclosure will be described in an exemplifying manner. Configurations in the following embodiments are exemplifications, and the present disclosure is not limited to the configurations in the embodiments.

First Embodiment

<Configuration>

Figure 1:
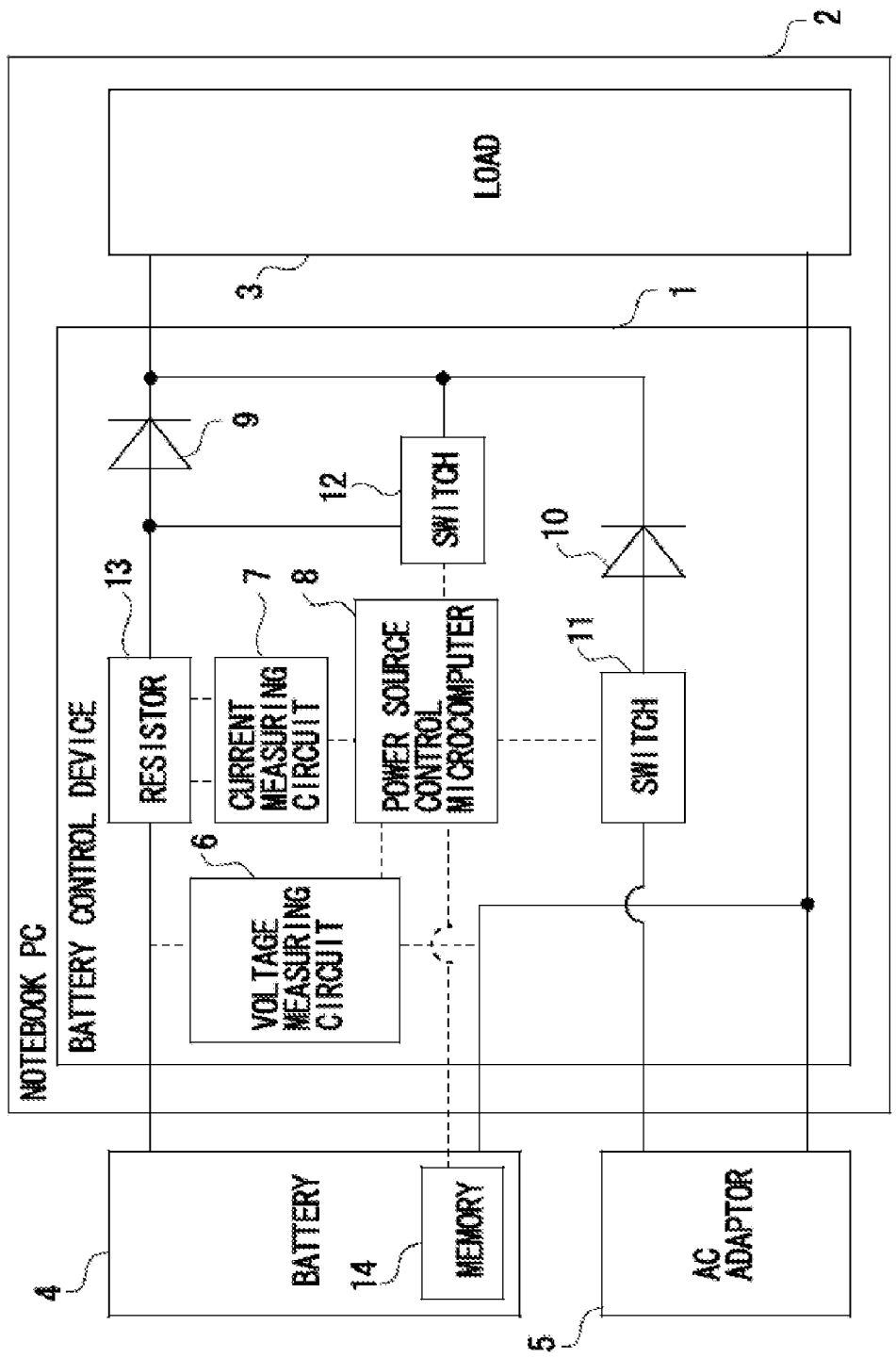
FIG. 1 is a diagram of a configuration of a notebook type personal computer mounted with a battery control device.

FIG. 1 illustrates a diagram of a configuration of a notebook type personal computer (notebook PC) 2 (corresponding to an [electronic apparatus] according to the present disclosure) mounted with a battery control device 1 according to a first embodiment. The notebook PC 2 has built-in devices such as a CPU (Central Processing Unit) and a hard disk (which will hereinafter be generically termed a [load 3]). The load 3 is operated by electric power supplied from a battery 4 and an AC adaptor 5 connected to the notebook PC 2. It is to be noted that the electric power supplied to the load 3 is electrically supplied from the battery 4 and the AC adaptor 5 via the battery control device 1. Further, a premise is that an output voltage of the AC adaptor 5 is higher than an output voltage of the battery 4. Note that the battery 4 may also be demountable from the notebook PC 2.

The first embodiment adopts the AC adaptor 5 as a power source other than the battery 4, however, the present disclosure is not limited to this power source. Namely, even in a state where none of the electric power is supplied from the battery 4, it may be sufficient if the battery control device 1 remains operable. Accordingly, a second battery may be used as a substitute for the AC adaptor 5, and the battery control device 1 may be operated by a power source other than the second battery.

The battery control device 1 includes a switch 11 that opens and closes an electric line connecting the AC adaptor 5 to the load 3, a voltage measuring circuit 6 (corresponding to a [voltage measuring unit] according to the present disclosure) that measures a voltage of the battery 4, a current measuring circuit 7 (corresponding to a [current measuring unit] according to the present disclosure) that measures an electric current of the battery, a power source control microcomputer 8 (corresponding to a [power source control unit] and a [control circuit] according to the present disclosure) that outputs a control signal to the switch 11 and inputs measuring signals from the voltage measuring circuit 6 and from the current measuring circuit 7, a diode 9 for blocking a reverse current to the battery 4, a diode 10 for blocking the reverse current to the AC adaptor 5, and a switch 12 that opens and closes an electric line connecting the AC adaptor 5 to the battery 4. Note that the battery control device 1 may also be electrically connected to a memory 14 provided inside the battery 4.

The switch 11 opens and closes upon receiving a command from the power source control microcomputer 8. When the switch 11 opens, the electric power is supplied to the load 3 from the battery 4. While on the other hand, when the switch 11 closes, because of the output voltage of the AC adaptor 5 being higher than the output voltage of the battery 4, the power supply to the load 3 from the battery 4 is stopped, and the power supply to the load 3 from the AC adaptor 5 is started. Namely, the switch 11 thus opens and closes, thereby controlling the power supply to the load 3 from the battery 4. It should be noted that the switch 11 may include using a semiconductor switch etc in addition to the opening/closing unit such as an electromagnetic contactor that physically opens and closes the electric line.

Thus, a power source switchover circuit is built up by the circuit constructed of the diode 9, the diode 10 and the switch 11, whereby the power source can be switched over without any instantaneous drop of the voltage of the load 3. Further, on the occasion of measuring internal impedance, a capacitance, etc of the battery 4, the AC adaptor 5 does not need detaching. Note that the switch 11 may also be provided halfway of the electric line extending from the battery 4 to the load 3.

The switch 12 performs the opening/closing operations upon receiving a command from the power source control microcomputer 8. When the switch 12 closes, the electric power is supplied to the battery 4 from the AC adaptor 5, thereby charging the battery 4 with the electricity. While on the other hand, when the switch 12 opens, the power supply to the battery 4 from the AC adaptor 5 is stopped. Namely, the power supply to the battery 4 from the AC adaptor 5 is controlled by opening and closing the switch 12.

The voltage measuring circuit 6 measures a potential difference between a positive pole and a negative pole of the battery 4, and transmits a signal about the output voltage of the battery 4 to the power source control microcomputer 8. Further, the voltage measuring circuit 6 measures the potential difference between the positive pole and the negative pole of the battery 4, and transmits a signal about the input voltage to the battery 4 to the power source control microcomputer 8. Note that the voltage measuring circuit 6 is capable of always measuring and transmitting, irrespective of the opening/closing states of the switch 11, the output voltage of the battery 4 to the power source control microcomputer 8. Further, the voltage measuring circuit 6 is capable of always measuring and transmitting, irrespective of the opening/closing states of the switch 12, the input voltage to the battery 4 to the power source control microcomputer 8.

The current measuring circuit 7 measures an output current of the battery 4, and transmits a signal about the output current of the battery 4 to the power source control microcomputer 8. The measurement of the output current of the battery 4 involves measuring a quantity of voltage drop at a resistor 13 provided between the battery 4 and the load 3, and measuring the output current of the battery 4 from the quantity of the voltage drop and a resistance value. It is to be noted that if the power supply to the load 3 from the battery 4 is stopped by closing the switch 11, the output current of the battery 4, which is measured by the current measuring circuit 7, is 0(A). Further, the current measuring circuit 7 measures the input current to the battery 4 and transmits a signal about the input current of the battery 4 to the power source control microcomputer 8. The measurement of the input current to the battery 4 involves measuring a quantity of voltage rise at the resistor 13, and measuring the input current to the battery 4 from the quantity of the voltage rise and the resistance value.

The power source control microcomputer 8 controls the power supply to the load 3 from the battery 4 by opening and closing the switch 11. Further, the power source control microcomputer 8 measures a state of the battery 4 based on the signals transmitted from the voltage measuring circuit 6 and from the current measuring circuit 7. Moreover, the power source control microcomputer 8 is constructed of a CPU (Central Processing Unit), a ROM (Read Only Memory), a RAM (Random Access Memory), input/output interfaces, etc. The CPU executes programs preinstalled into the ROM and the RAM, thereby actualizing the respective operations of the battery control device 1.

Figure 2:
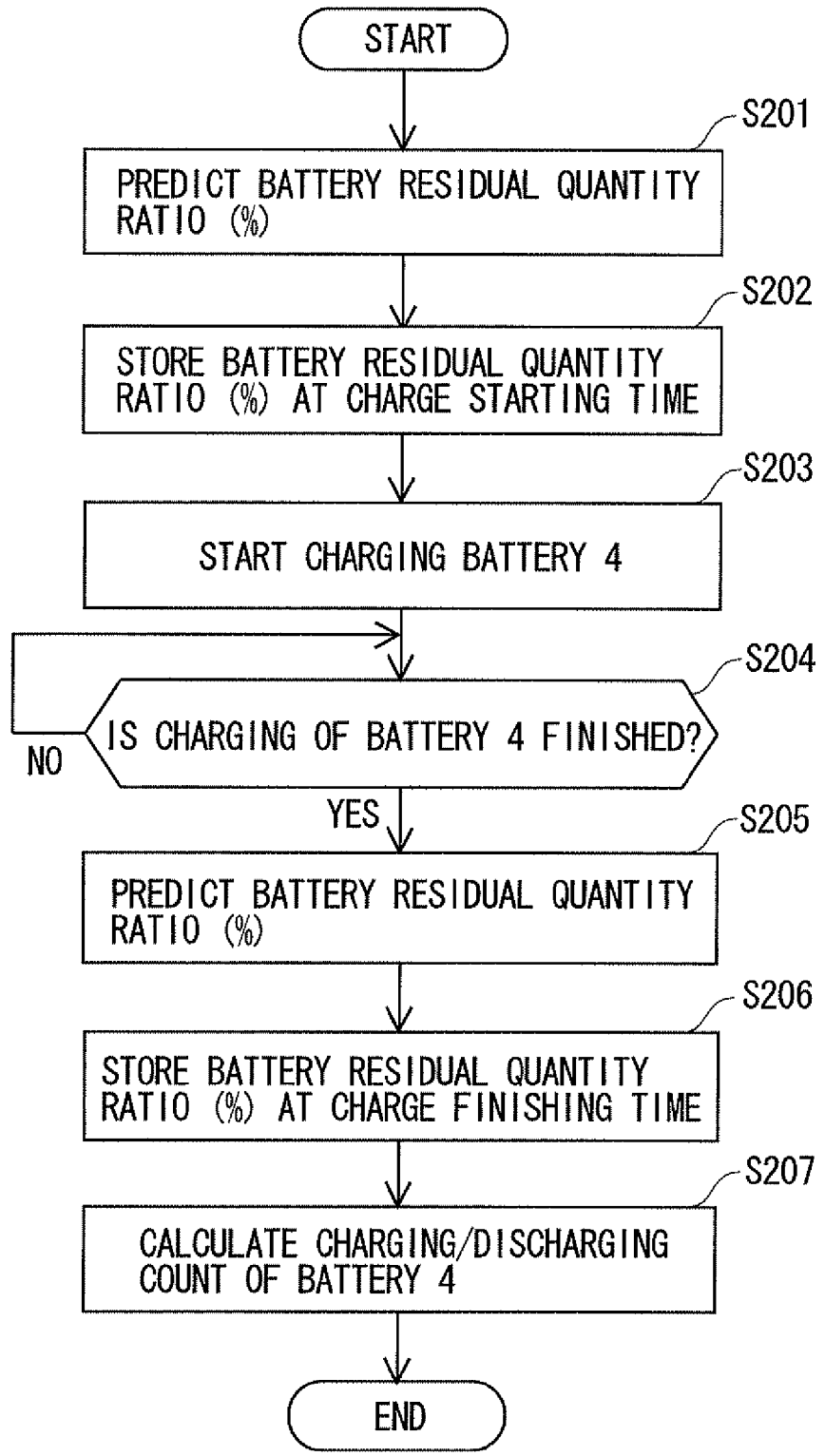
FIG. 2 is a flowchart of control by a battery control device according to a first embodiment.

Next, the operation of the battery control device 1 according to the first embodiment will be described with reference to FIG. 2. FIG. 2 is a flowchart of the control by the battery control device 1 according to the first embodiment. FIG. 2 illustrates an operation that the power source control microcomputer 8 calculates a charging/discharging count of the battery 4 in the case of charging the battery 4 with the electricity.

To start with, the power source control microcomputer 8 detects via the switch 11 that the notebook PC 2 is electrically connected to the AC adaptor 5. To be specific, in a case where the AC adaptor 5 has already been attached to the notebook PC 2, when the battery control device 1 is started up by pressing a power source switch of the notebook PC 2, the power source control microcomputer 8 detects that the notebook PC 2 is electrically connected to the AC adaptor 5. Further, in such a case that the power source switch of the notebook PC 2 has already been turned ON, when the AC adaptor 5 is attached to the notebook PC 2, the power source control microcomputer 8 detects that the notebook PC 2 is electrically connected to the AC adaptor 5. The power source control microcomputer 8, when detecting that the notebook PC 2 is electrically connected to the AC adaptor 5, predicts a battery residual quantity ratio (%) of the battery 4 (S201).

In the case of predicting the battery residual quantity ratio (%) of the battery 4, the power source control microcomputer 8 sends a command to the switch 11 to set the switch itself in an opened state. When the switch 11 has already opened, the power source control microcomputer 8 may not send the command to the switch 11 to set the switch itself in the opened state. When the switch 11 opens, the source of supplying the electric power to the load 3 is the battery 4. Accordingly, it follows that the battery 4 discharges the electricity. Then, the power source control microcomputer 8 predicts the battery residual quantity ratio (%) of the battery 4 when discharging the electricity.

Herein, the prediction of the battery residual quantity ratio (%) of the battery 4 will be explained. For instance, a lithium ion battery has a characteristic that a battery voltage changes at the battery residual quantity ratio (%). Therefore, the battery residual quantity ratio (%) can be predicted by measuring an open-circuit voltage (OCV) of the battery 4. A profile of how the battery voltage changes is not linear, and hence relationships between the pre-measured battery voltages and the battery residual quantity ratios (%) are sorted into a map (table), and the battery residual quantity ratio (%) of the battery 4 can be predicted by referring to this map.

During the charging/discharging operations of the battery 4, a terminal voltage (V) of the battery 4 and the open-circuit voltage (OCV) of the battery 4, exhibit values different from each other. This is because the voltage rise or the voltage drop of the terminal voltage (V) of the battery 4 occurs due to the internal impedance and the charging/discharging current of the battery 4. It is therefore necessary to obtain the open-circuit voltage (OCV) of the battery 4 at the charging/discharging time. The open-circuit voltage (OCV) of the battery 4 at the charging/discharging time can be obtained from the terminal voltage (V) of the battery 4, a charging/discharging current (I) of the battery 4 and internal impedance (Ri) of the battery 4 in the following calculation formula (1).

$$OCV = V + (I \times Ri) \quad (1)$$

In the calculation formula (1), a sign of the charging/discharging current when the electricity is discharged from the battery 4 be set as a positive sign, whereas the sign of the charging/discharging current when the battery 4 is charged with the electricity be set as a negative sign.

Specifically, the power source control microcomputer 8 acquires a signal about the terminal voltage (V) of the battery 4 from the voltage measuring circuit 6. Further, the power source control microcomputer 8 acquires a signal about the charging/discharging current (I) from the current measuring circuit 7. The internal impedance (Ri) of the battery 4 involves employing a value calculated from the pre-measured result. For example, the internal impedance (Ri) of the battery 4, which is previously recorded in the power source control microcomputer 8, may also be used. In this case, when manufacturing the battery 4, the internal impedance (Ri) of the battery 4, which is pre-measured by the measuring device, may also be recorded in the power source control microcomputer 8. Moreover, after manufacturing the battery 4, the internal impedance (Ri) of the battery 4, which is pre-measured by the measuring device, may also be recorded in the power source control microcomputer 8.

Further, the internal impedance (Ri) of the battery 4 can be calculated through the following operation by the battery control device 1. A premise is that the following operation by the battery control device 1 is to be conducted before such an operation that the power source control microcomputer 8 predicts the battery residual quantity ratio (%) of the battery 4.

Figure 3:
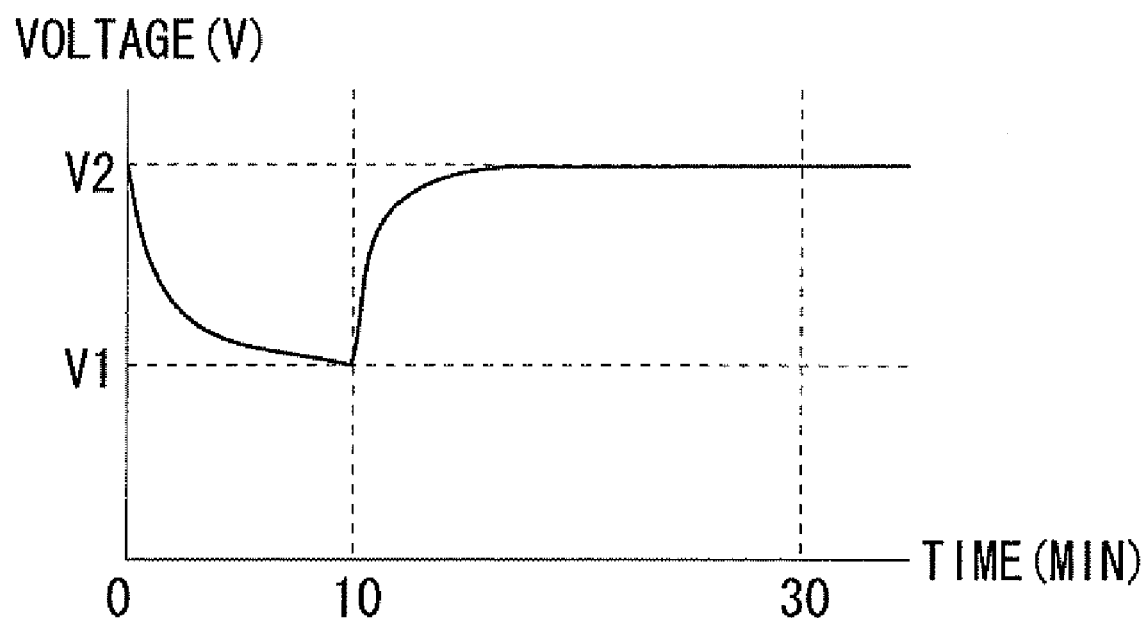
FIG. 3 is a graph showing of how an output voltage of the battery changes according to the time.
Figure 4:
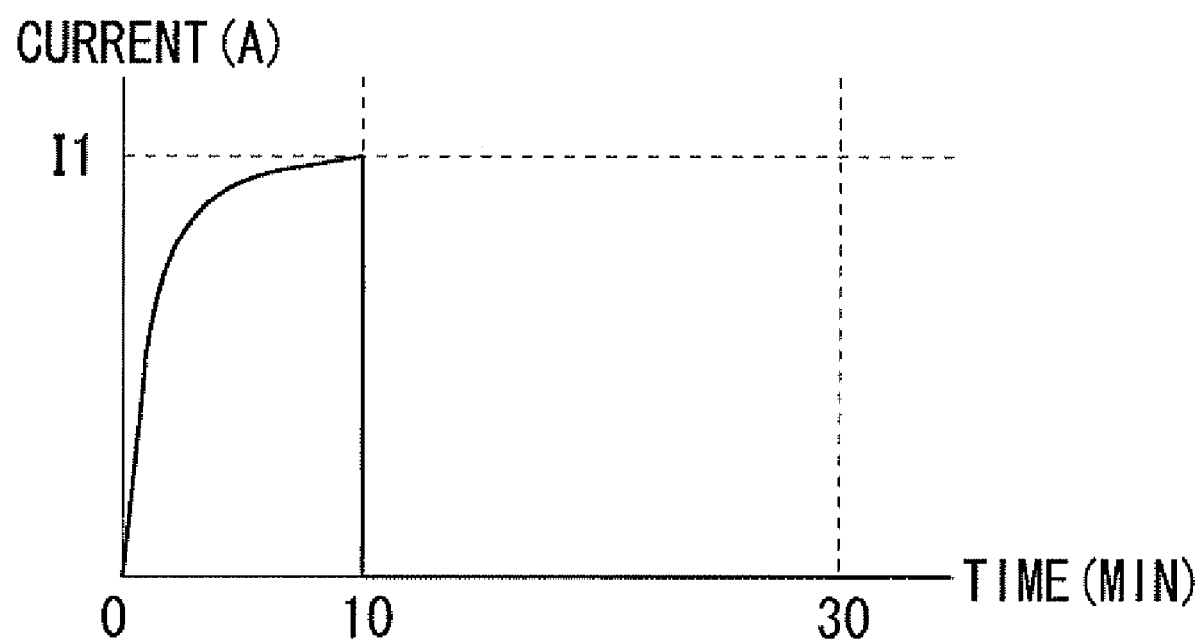
FIG. 4 is a graph showing of how an output current of the battery changes according to the time.

The power source control microcomputer 8 opens the switch 11 and switches over the source of supplying the electric power to the load 3 to the battery 4 from the AC adaptor 5. The time when switching over the source of supplying the electric power to the load 3 to the battery 4 from the AC adaptor 5, is set to "0" min. Changes in voltage and in current of the battery 4 at this time are illustrated in FIGS. 3 and 4. FIG. 3 is a graph showing the change in output voltage of the battery 4 according to the time. As shown in FIG. 3, the output voltage of the battery 4 abruptly drops simultaneously when starting the supply of the electricity to the load 3 and halts for another change at a point of a time elapse of approximately 10 min. Further, FIG. 4 is a graph showing the change in output current of the battery 4 according to the time. As shown in FIG. 4, the output current of the battery 4 abruptly rises simultaneously when starting the supply of the electricity to the load 3 and halts for another change at a point of a time elapse of approximately 10 min.

The power source control microcomputer 8, after the elapse of 10 min since the power supply source to the load 3 has been switched over to the battery 4 from the AC adaptor 5 by opening the switch 11, acquires a signal about an output voltage (V1) of the battery 4 from the voltage measuring circuit 6, and acquires a signal about an output current (I1) of the battery 4 from the current measuring circuit 7.

The power source control microcomputer 8 switches over the power supply source to the load 3 to the AC adaptor 5 from the battery 4 by closing the switch 11. As shown in FIG. 3, the output voltage of the battery 4 abruptly rises simultaneously with the stop of the electric supply to the load 3, and remains almost completely constant after an elapse of 30 min. Further, as shown in FIG. 4, the output current of the battery 4 turns out to be 0(A) simultaneously with the stop of the electric supply to the load 3.

Next, the power source control microcomputer 8 acquires a signal about an output voltage (V2) defined as the open-circuit voltage of the battery 4 from the voltage measuring circuit 6 after an elapse of 20 min since the power supply source to the load 3 has been switched over to the AC adaptor 5 from the battery 4 by closing the switch 11 (in other words, after an elapse of 30 min since the power supply source to the load 3 has been switched over to the battery 4 from the AC adaptor 5 by opening the switch 11).

Then, the power source control microcomputer 8 calculates the internal impedance (Ri) of the battery 4 from the acquired voltage and current values V1, I1 and V2. The internal impedance (Ri) of the battery 4 can be obtained by the following calculation formula (2).

$$Ri = (V2 - V1)/I1 \quad (2)$$

The calculated internal impedance (Ri) of the battery 4 is recorded inside the power source control microcomputer 8. Through the thus-performed calculation of the internal impedance (Ri) of the battery 4 and the recording operation, the power source control microcomputer 8 can use the internal impedance (Ri) of the battery 4.

Next, the power source control microcomputer 8 calculates the open-circuit voltage (OCV) of the battery 4 at the charging/discharging time from the terminal voltage (V) of the battery 4, the charging/discharging current (I) of the battery 4 and the internal impedance (Ri) of the battery 4 by use of the calculation formula (1).

The power source control microcomputer 8 acquires the map stored in the memory 14 within the battery 4, and calculates the battery residual quantity ratio (%) of the battery 4 by collating the calculated open-circuit voltage (OCV) of the battery 4 at the charging/discharging time with the map.

Figure 5:
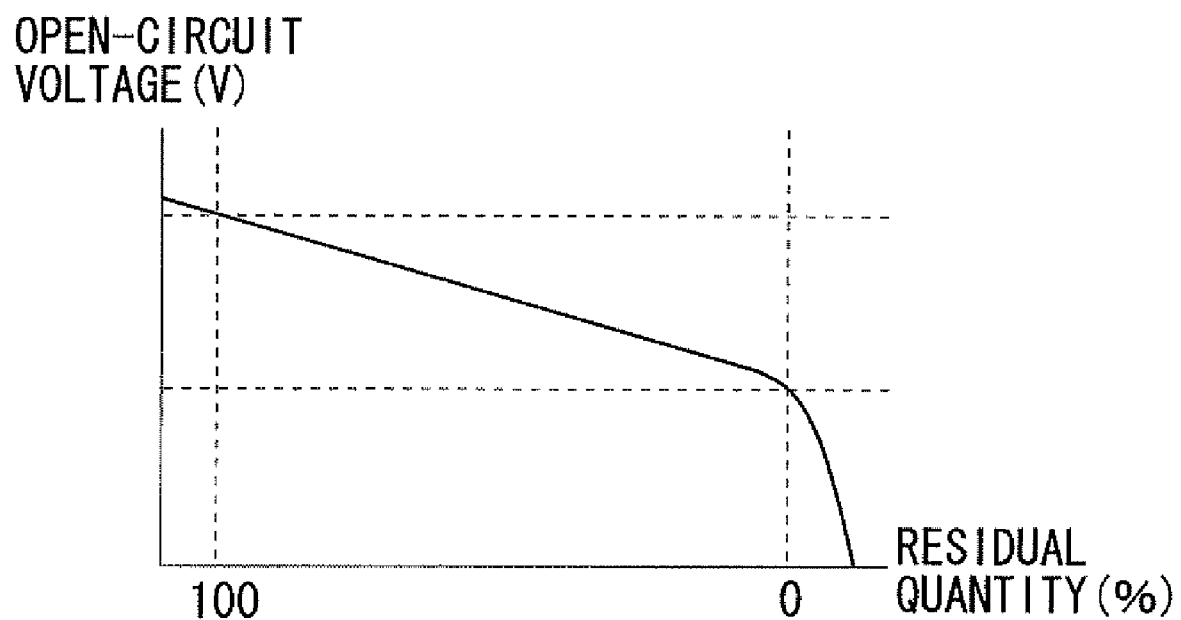
FIG. 5 is a graph showing a relationship between a residual quantity ratio of the battery and an open-circuit voltage.

FIG. 5 is a graph (corresponding to [relative information] according to the present disclosure) representing a relationship between the battery residual quantity ratio (%) of the battery 4 and the open-circuit voltage (OCV) of the battery 4 at the charging/discharging time. This relationship between the battery residual quantity ratio (%) of the battery 4 and the open-circuit voltage (OCV) of the battery 4 at the charging/discharging time, is based on data previously measured by the measuring device when manufacturing the battery 4. Namely, this graph is generated in a way that measures the open-circuit voltage (OCV) of the battery 4 at the charging/discharging stepwise from a full-charged state of the battery 4 to a discharge terminating state. The thus-generated graph is previously stored as a map in the memory 14 within the battery 4. Further, the power source control microcomputer 8 may also be stored with this graph as the map.

Next, the power source control microcomputer 8 is stored inside with the calculated battery residual quantity ratio (%) of the battery 4 as a battery residual quantity ratio (%) at the charge starting time (S202).

Then, the power source control microcomputer 8 starts charging the battery 4 with the electricity (S203). To be specific, the power source control microcomputer 8 sends a command to the switch 11 to get the switch 11 itself into the closed state. Further, the power source control microcomputer 8 sends the command to the switch 12 to get the switch 12 itself into the closed state. If the switch 12 has already been closed, the power source control microcomputer 8 may not send the command to the switch 12 to get the switch 12 itself into the closed state. The switch 11 gets into the closed state and the switch 12 also gets into the closed state, in which case the AC adaptor 5 and the battery 4 get into the electrically connected state. Namely, the electric power supplied from the AC adaptor 5 is supplied to the battery 4, thus starting charging the battery 4 with the electricity.

The power source control microcomputer 8 determines whether or not the battery 4 finishes being charged with the electricity (S204). If the battery 4 comes to the full-charge state, the power source control microcomputer 8 determines that the battery 4 has finished being charged with the electricity. Further, if the AC adaptor 5 is detached from the notebook PC 2, the power source control microcomputer 8 determines that the battery 4 has finished being charged with the electricity.

If the battery 4 finishes being charged with the electricity (the process in S204, YES), the power source control microcomputer 8 predicts the battery residual quantity ratio (%) of the battery 4 (S205). The process of predicting the battery residual quantity ratio (%) of the battery 4 in S205 is executed in the same way as executing the process of predicting the battery residual quantity ratio (%) of the battery 4 in S201. Namely, the power source control microcomputer 8 calculates the battery residual quantity ratio (%) of the battery 4 at the charge ending time of the battery 4.

Whereas if the battery 4 does not finish being charged with the electricity (the process in S204, NO), the power source control microcomputer 8 repeats the process in S204 till the battery 4 finishes being charged with the electricity.

When calculating the battery residual quantity ratio (%) of the battery 4 at the charge ending time of the battery 4, the power source control microcomputer 8 is stored inside with the calculated battery residual quantity ratio (%) of the battery 4 as the battery residual quantity ratio (%) at the charge ending time (S206).

Next, the power source control microcomputer 8 calculates a charging/discharging count of the battery 4 (S207). The power source control microcomputer 8 calculates the charging/discharging count of the battery 4 from the battery residual quantity ratio (%) at the charge starting time, the battery residual quantity ratio (%) at the charge ending time and a correction coefficient. The charging/discharging count of the battery 4 can be obtained by the following calculation formula (3).

Charging/discharging of battery 4={battery residual quantity ratio (%) at charge ending time−battery residual quantity ratio (%) at charge starting time}/100(%)×correction coefficient $n$ (3)

The correction coefficient n will be explained. The correction coefficient n can be calculated by performing a test beforehand. Specifically, the electricity is discharged from the battery 4 till the battery residual quantity ratio (%) of the battery 4 comes to a 50% state from the full-charge state of the battery 4. Thereafter, the battery 4 is charged with the electricity till the battery 4 comes to the full-charge state. This discharging/charging cycle of the battery 4 is repeated, thereby acquiring data of a discharge capacity of the battery 4. The cycle of the discharge of the battery 4 till the battery residual quantity ratio (%) comes to the 50% state from the full-charge state and the charge of the battery 4 till the battery residual quantity ratio (%) comes to the full-charge state from the 50% state, is referred to as a charge/discharge 50% cycle in the present specification. In the test for calculating the correction coefficient n, when the charge/discharge 50% cycle is conducted once, the charging/discharging count is counted "0.5".

Moreover, the electricity is discharged from the battery 4 till the battery residual quantity ratio (%) of the battery 4 becomes a 0% state from the full-charge state of the battery 4. Thereafter, the battery 4 is charged with the electricity till the battery 4 comes to the full-charge state. This charge/discharge cycle of the battery 4 is repeated, thereby acquiring the data of the discharge capacity of the battery 4. The cycle of the discharge of the battery 4 till the battery residual quantity ratio (%) becomes the 0% state from the full-charge state and the charge of the battery 4 till the battery residual quantity ratio (%) comes to the full-charge state from the 0% state, is referred to as a charge/discharge 100% cycle in the present specification. In the test for calculating the correction coefficient n, when the charge/discharge 100% cycle is conducted once, the charging/discharging count is counted "1".

With the charge/discharge repetition of the battery 4, the battery 4 gets deteriorated, and a charge/discharge-enabled capacity decreases. A rate of the deterioration of the battery differs (i.e., the charge/discharge-enabled capacity of the battery 4 differs) in a case where the discharge of the battery 4 is conducted till the battery residual quantity ratio (%) becomes the 0% state from the full-charge state while the charge of the battery 4 is performed till the battery residual quantity ratio (%) becomes the full-charge state from the 0% state, and in a case where the discharge of the battery 4 is conducted till the battery residual quantity ratio (%) becomes the 50% state from the full-charge state while the charge of the battery 4 is performed till the battery residual quantity ratio (%) becomes the full-charge state from the 50% state. Such being the case, it is necessary to calculate the charging/discharging count corresponding to the deterioration of the battery 4 in a way that multiplies the charging/discharging count by the correction coefficient corresponding to the discharge capacity (or the charge capacity) decreased due to the deterioration of the battery 4.

A degree of decrease in discharge capacity of the battery 4 in the case of repeating the charge/discharge 50% cycle is compared with a degree of decrease in discharge capacity of the battery 4 in the case of repeating the charge/discharge 100% cycle.

Figure 6:
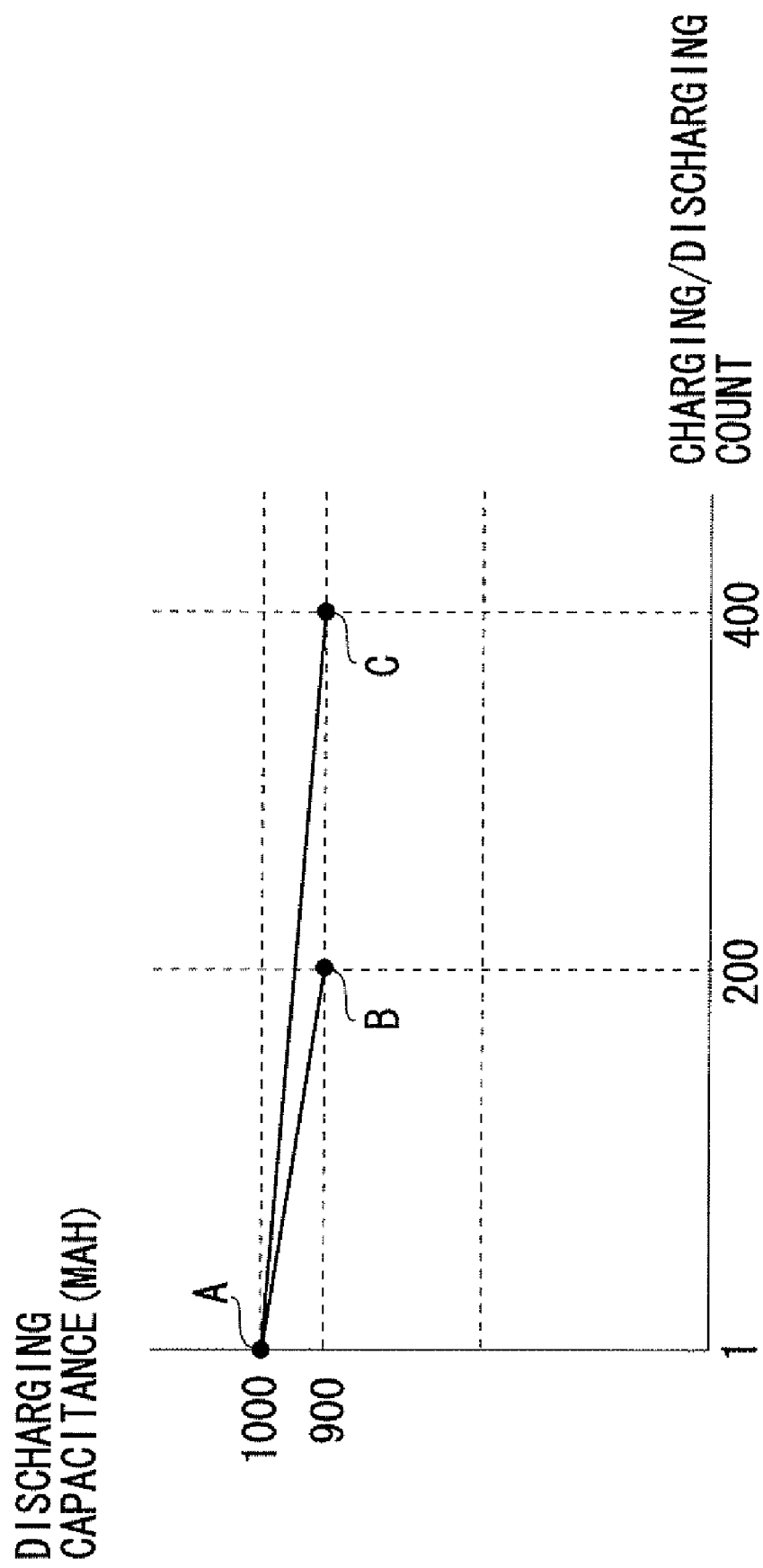
FIG. 6 is a graph showing a relationship between a discharge capacity and a charging/discharging count of the battery.

FIG. 6 is a diagram showing a change in discharge capacity of the battery 4 in the case of repeating the charge/discharge 50% cycle and a change in discharge capacity of the battery 4 in the case of repeating the charge/discharge 100% cycle. The axis of ordinate in FIG. 6 indicates the discharge capacity of the battery 4. The axis of abscissa in FIG. 6 indicates the charging/discharging count of the battery 4.

A point A shown in FIG. 6 represents the charging/discharging count of the charge/discharge 50% cycle and the charging/discharging count of the charge/discharge 100% cycle when the discharge capacity of the battery 4 is on the order of 1000 mAh (milli amp hours). As shown in FIG. 6, when the discharge capacity of the battery 4 is 1000 mAh, both of the charging/discharging count of the charge/discharge 50% cycle and the charging/discharging count of the charge/discharge 100% cycle are "1".

A point B shown in FIG. 6 represents a charging/discharging count of the charge/discharge 50% cycle in the case where the discharge capacity of the battery 4 decreases down to 900 mAh. As shown in FIG. 6, when the discharge capacity of the battery 4 is on the order of 900 mAh, the charging/discharging count of the charge/discharge 50% cycle is "200".

A point C shown in FIG. 6 represents a charging/discharging count of the charge/discharge 100% cycle in the case where the discharge capacity of the battery 4 decreases down to 900 mAh. As shown in FIG. 6, when the discharge capacity of the battery 4 is on the order of 900 mAh, the charging/discharging count of the charge/discharge 100% cycle is "400".

In the case of the charge/discharge 100% cycle, the charging/discharging count of the battery 4 requires "400" in order for the discharge capacity of the battery 4 to decrease down to 900 mAh. By contrast, in the case of the charge/discharge 50% cycle, the charging/discharging count of the battery 4 requires "200" in order for the discharge capacity of the battery 4 to decrease down to 900 mAh. Namely, the decrease in discharge capacity of the battery 4 in the case of the charge/discharge 50% cycle is greater than the decrease in discharge capacity of the battery 4 in the case of the charge/discharge 100% cycle. Then, with respect to the charging/discharging count of the battery 4 for the reduction in discharge capacity of the battery 4, the correction coefficient n is obtained for adjusting the charge/discharge 100% cycle and the charge/discharge 50% cycle.

The correction coefficient n can be obtained by the following calculation formula (4).

Correction coefficient $n$=charging/discharging count of charge/discharge 100% cycle/charging/discharging count of charge/discharge 50% cycle  (4)

Figure 7:
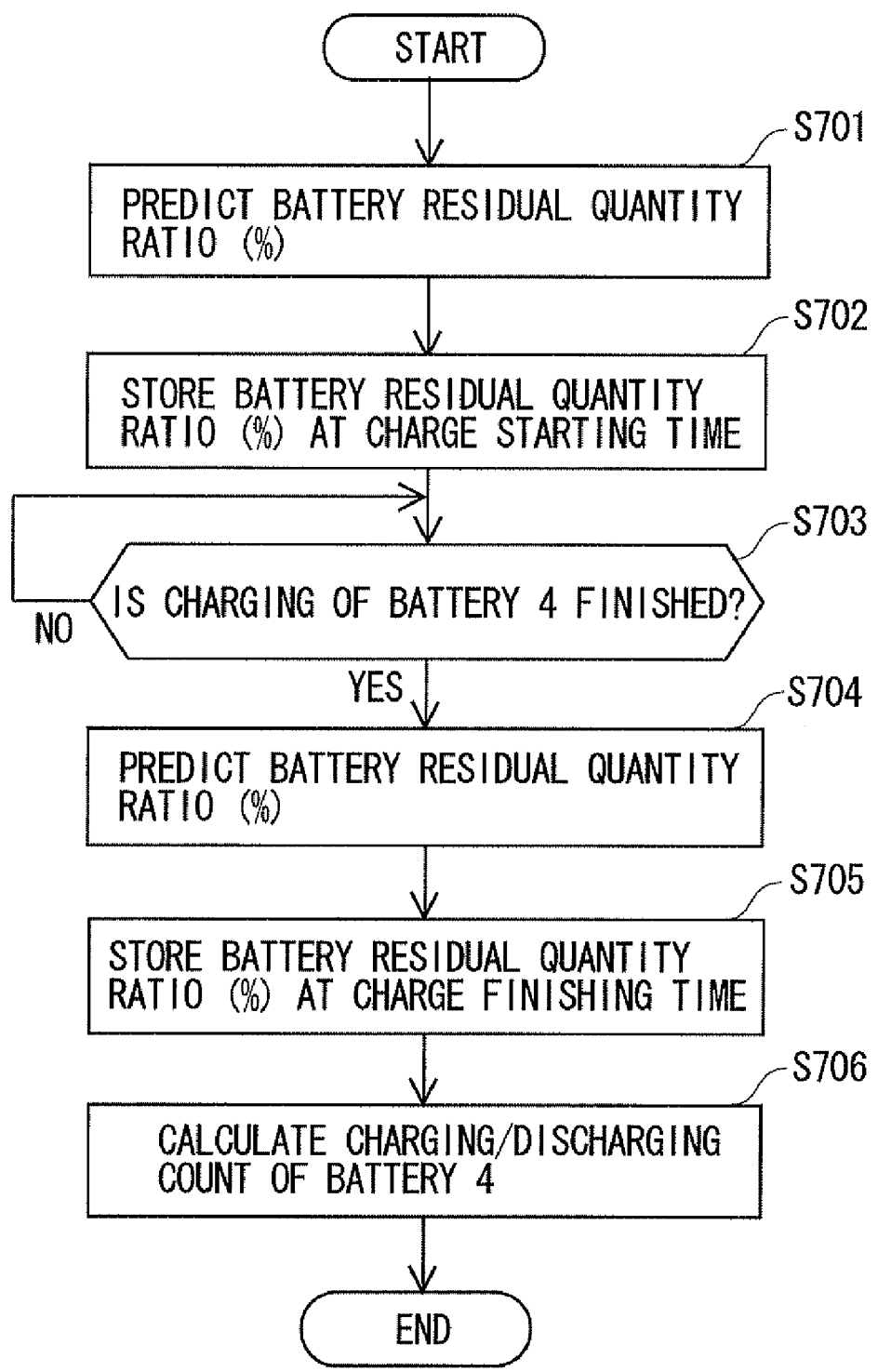
FIG. 7 is a flowchart of the control by the battery control device according to a second embodiment.

In the calculation formula (4), when calculating the correction coefficient n, the counts given when the discharge capacities of the battery 4 decrease down to the same value are employed as the charging/discharging count of the charge/discharge 100% cycle and the charging/discharging count of the charge/discharge 50% cycle. For example, when the charging/discharging count of the charge/discharge 100% cycle is "400" and when the charging/discharging count of the charge/discharge 50% cycle is "200", the correction coefficient n is given such as n=400/200=2. In FIG. 7, the values of the discharge capacity of the battery 4 and the values of the charging/discharging count of the battery 4 are the exemplifications, and the present disclosure is not limited to these values.

The power source control microcomputer 8 can calculate the charging/discharging count of the battery 4, which takes account of the deterioration of the battery 4, by use of the correction coefficient n.

The power source control microcomputer 8 is internally stored with the charging/discharging count of the battery 4 that is calculated in the process in S207. If the value of the calculated charging/discharging count of the battery 4 exceeds "1", the power source control microcomputer 8 is recorded inside with "1" as the charging/discharging count of the battery 4. For instance, when the calculated charging/discharging count of the battery 4 takes a value of "0.8", "0.8" is recorded as the charging/discharging count of the battery 4. For example, when the calculated charging/discharging count of the battery 4 takes a value of "1.2", "1" is recorded as the charging/discharging count of the battery 4.

There is a case in which the value of the charging/discharging count exceeds "1" due to the use of the correction coefficient n. Even when performing the full-charge and the complete discharge of the battery 4, however, the actual charging/discharging count does not exceed "1". Hence, when the value of the calculated charging/discharging count of the battery 4 exceeds "1", "1" is recorded as the charging/discharging count of the battery 4 inside in the power source control microcomputer 8.

The power source control microcomputer 8 integrates the charging/discharging count of the battery 4 each time the charge/discharge of the battery 4 is repeated. Namely, if the charging/discharging count of the battery 4 has already been recorded inside in the power source control microcomputer 8, the calculated charging/discharging count of the battery 4 is added to the recorded charging/discharging count of the battery 4.

The battery control device 1 according to the first embodiment is capable of calculating the charging/discharging count of the battery 4 even when the battery residual quantity ratio (%) of the battery 4 at the charge starting time is not 0% (i.e., even when the battery 4 is not in the complete discharge state). Further, the battery control device 1 according to the first embodiment is capable of calculating the charging/discharging count of the battery 4 even when the battery residual quantity ratio (%) of the battery 4 at the charge ending time is not 100% (i.e., even when the battery 4 is not in the full-charge state).

Second Embodiment

Next, the operation of the battery control device 1 according to a second embodiment will be described with reference to FIG. 7. The first embodiment has exemplified the operation in which the power source control microcomputer 8 calculates the charging/discharging count of the battery 4 in the case of charging the battery 4 with the electricity. The second embodiment will exemplify an operation in which the power source control microcomputer 8 calculates the charging/discharging count of the battery 4 in the case of discharging the electricity from the battery 4. Other constructions and operations are the same as those in the first embodiment. Such being the case, the same components are marked with the same numerals and symbols as those in the first embodiment, and their explanations are omitted. Further, the drawings in FIGS. 1 through 6 will be referred to when the necessity may arise. FIG. 7 is a flowchart of the control by the battery control device 1 according to the second embodiment.

To begin with, the power source control microcomputer 8 detects via the switch 11 that the notebook PC 2 is not electrically connected to the AC adaptor 5. Specifically, if the AC adaptor 5 is not attached to the notebook PC 2 and when the battery control device 1 is started up by pressing the power switch of the notebook PC 2, the power source control microcomputer 8 detects that the notebook PC 2 is not electrically connected to the AC adaptor 5. Further, in a case where the power switch of the notebook PC 2 has already been turned ON, when the AC adaptor 5 is detached from the notebook PC 2, the power source control microcomputer 8 detects that the notebook PC 2 is not electrically connected to the AC adaptor 5. The power source control microcomputer 8, when detecting that the notebook PC 2 is not electrically connected to the AC adaptor 5, predicts the battery residual quantity ratio (%) of the battery 4 (S701). If the notebook PC 2 is not electrically connected to the AC adaptor 5, the power supply source to the load 3 is the battery 4. Accordingly, it follows that the battery 4 discharges the electricity. Then, the power source control microcomputer 8 calculates the battery residual quantity ratio (%) of the battery 4 at the discharging time. The process that the power source control microcomputer 8 calculates the battery residual quantity ratio (%) of the battery 4 at the discharging time, is the same as in the first embodiment, and hence its explanation is omitted.

Next, the power source control microcomputer 8 is stored inside with the calculated battery residual quantity ratio (%) of the battery 4 as the battery residual quantity ratio (%) at the discharge starting time (S702).

Subsequently, the power source control microcomputer 8 determines whether or not the battery 4 finishes discharging the electricity (S703). The power source control microcomputer 8, when detecting that the power supply source to the load 3 is the AC adaptor 5, determines that the battery 4 has finished discharging the electricity. To be specific, the power source control microcomputer 8, when detecting via the switch 11 that the AC adaptor 5 is attached to the notebook PC 2 and the notebook PC 2 is electrically connected to the AC adaptor 5, determines that the battery 4 has finished discharging the electricity. If the switch 11 remains closed, the power source control microcomputer 8 detects that the AC adaptor 5 has been attached to the notebook PC 2, and can detect that the power supply source to the load 3 is the AC adaptor 5.

If the battery 4 has finished discharging the electricity (the process in S703, YES), the power source control microcomputer 8 predicts the battery residual quantity ratio (%) of the battery 4 (S704). The process of predicting the battery residual quantity ratio (%) of the battery 4 in S704 is executed in the same way as executing the process of predicting the battery residual quantity ratio (%) of the battery 4 in S701. Namely, the power source control microcomputer 8 calculates the battery residual quantity ratio (%) of the battery 4 at the discharge ending time of the battery 4.

Whereas if the battery 4 does not yet finish discharging the electricity (the process in S703, NO), the power source control microcomputer 8 repeats the process in S703 till the battery 4 finishes discharging the electricity.

In the case of calculating the battery residual quantity ratio (%) of the battery 4 at the discharge ending time of the battery 4, the power source control microcomputer 8 is stored inside with the calculated battery residual quantity ratio (%) of the battery 4 as the battery residual quantity ratio (%) at the discharge ending time (S705).

Next, the power source control microcomputer 8 calculates the charging/discharging count of the battery 4 (S706). The charging/discharging count of the battery 4 can be obtained by the following calculation formula (5).

$$\text{Charging/discharging count of battery 4} = \{\text{battery residual quantity ratio (\%) at discharge starting time} - \text{battery residual quantity ratio (\%) at discharge ending time}\}/100(\%) \times \text{correction coefficient } n \quad (5)$$

The correction coefficient n is the same as in the first embodiment, and hence the explanation thereof is omitted.

The power source control microcomputer 8 is internally recorded with the charging/discharging count of the battery 4, which is calculated in the process in S706. If the calculated charging/discharging count of the battery 4 exceeds "1", the power source control microcomputer 8 is internally recorded with "1" as the charging/discharging count of the battery 4. For example, if the calculated charging/discharging count of the battery 4 takes a value "0.8", "0.8" is recorded as the charging/discharging count of the battery 4. For instance, if the calculated charging/discharging count of the battery 4 takes a value "1.2", "1" is recorded as the charging/discharging count of the battery 4.

The power source control microcomputer 8 integrates the charging/discharging count of the battery 4 each time the charge/discharge of the battery 4 is repeated. Namely, if the charging/discharging count of the battery 4 has already been recorded inside in the power source control microcomputer 8, the calculated charging/discharging count of the battery 4 is added to the recorded charging/discharging count of the battery 4.

The battery control device 1 according to the second embodiment is capable of calculating the charging/discharging count of the battery 4 even when the battery residual quantity ratio (%) of the battery 4 at the discharge starting time is not 100% (i.e., even when the battery 4 is not in the full-charge state). Further, the battery control device 1 according to the second embodiment is capable of calculating the charging/discharging count of the battery 4 even when the battery residual quantity ratio (%) of the battery 4 at the discharge ending time is not 0% (i.e., even when the battery 4 is not in the complete discharge state).

Further, while the battery 4 is charged with the electricity, the power source control microcomputer 8 may periodically predict the battery residual quantity ratio (%) of the battery 4. Namely, while the battery 4 is charged with the electricity, the power source control microcomputer 8 periodically calculates the open-circuit voltage (OCV) of the battery 4, and may periodically calculate the battery residual quantity ratio (%) of the battery 4 by collating the calculated open-circuit voltage (OCV) of the battery 4 with the map stored in the memory 14 of the battery 4. In this case, the power source control microcomputer 8, when detecting that the notebook PC 2 is not electrically connected to the AC adaptor 5, may use the periodically calculated value of the battery residual quantity ratio (%) of the battery 4 as a value of the battery residual quantity ratio (%) of the battery 4 at the discharging time.

Modified examples of the present disclosure will hereinafter be given as follows. Configurations and operations exemplified in the following modified examples may be combined with the configurations and the operations exemplified in the first embodiment and/or the second embodiment. Further, the configurations and the operations exemplified in a first modified example through a third modified example, which will hereinafter be given, may be combined with each other.

First Modified Example

Figure 8:
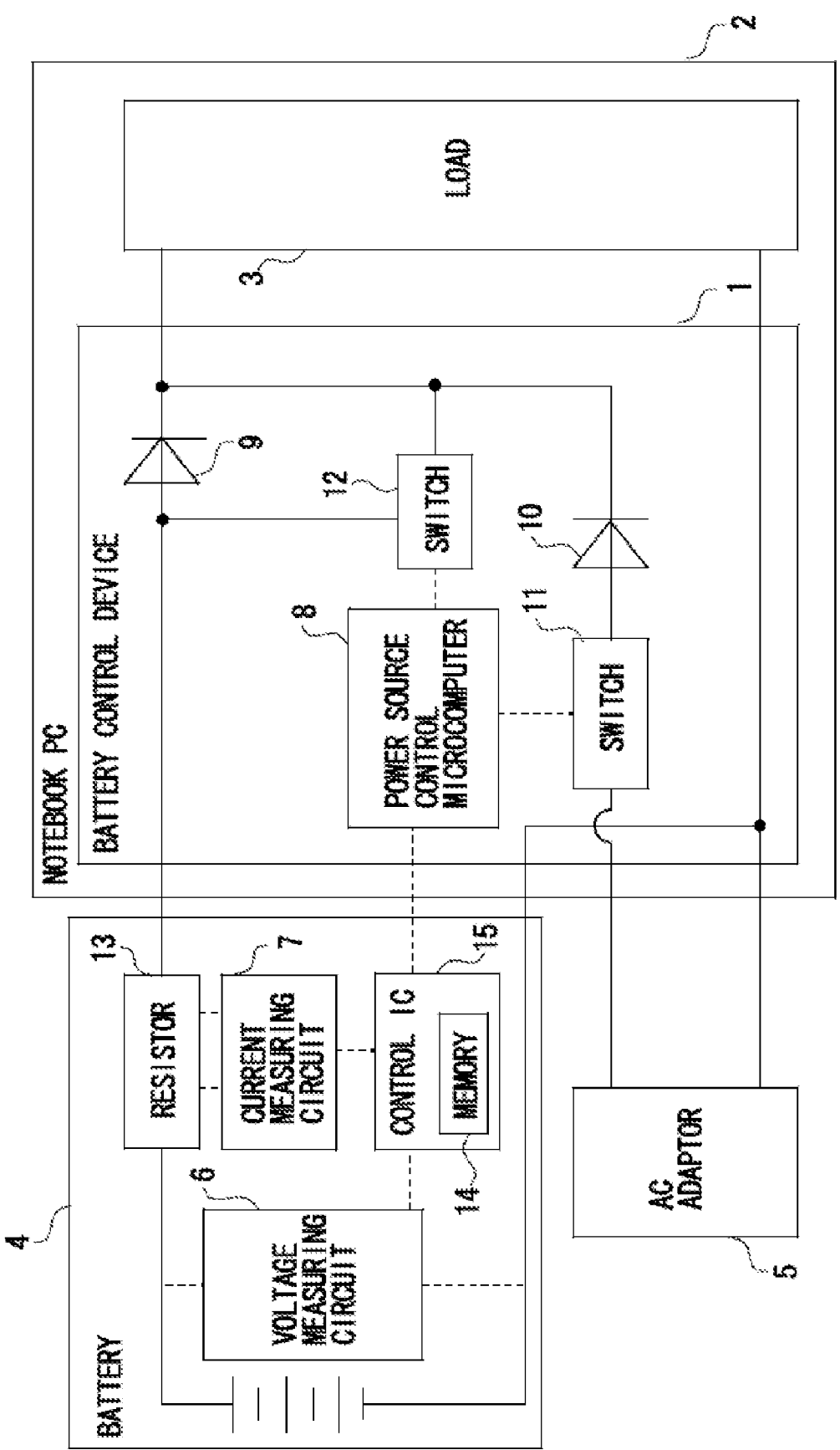
FIG. 8 is a diagram of a configuration of the notebook type personal computer mounted with the battery control device.

The battery control device 1 described above internally includes the voltage measuring circuit 6 and the current measuring circuit 7, however, the present disclosure is not limited to this configuration. FIG. 8 shows a diagram of a configuration of the notebook PC 2 mounted with the battery control device 1 according to the first modified example. As illustrated in FIG. 8, a control IC 15, the voltage measuring circuit 6 and the current measuring circuit 7 are provided within the battery 4 (battery pack), wherein a voltage signal measured by the voltage measuring circuit 6 and a current signal measured by the current measuring circuit 7 may be transferred via the control IC 15 to the power source control microcomputer 8. Moreover, the control IC 15 may be given the same functions as those possessed by the power source control microcomputer 8. Namely, the control IC 15 may perform the variety of operations carried out by the power source control microcomputer 8 in the first embodiment and the second embodiment.

Second Embodiment

The battery control device 1 may be modified so that the calculated charging/discharging count of the battery 4 is recorded in the memory 14 provided within the battery 4. Specifically, the power source control microcomputer 8 records the calculated charging/discharging count of the battery 4 in the memory 14 provided within the battery 4. Further, the power source control microcomputer 8 integrates the charging/discharging count of the battery 4 each time the charge/discharge of the battery 4 is repeated. Namely, if the charging/discharging count of the battery 4 has already been recorded in the memory 14, the calculated charging/discharging count of the battery 4 is added to the recorded charging/discharging count of the battery 4.

Third Modified Example

Figure 9:
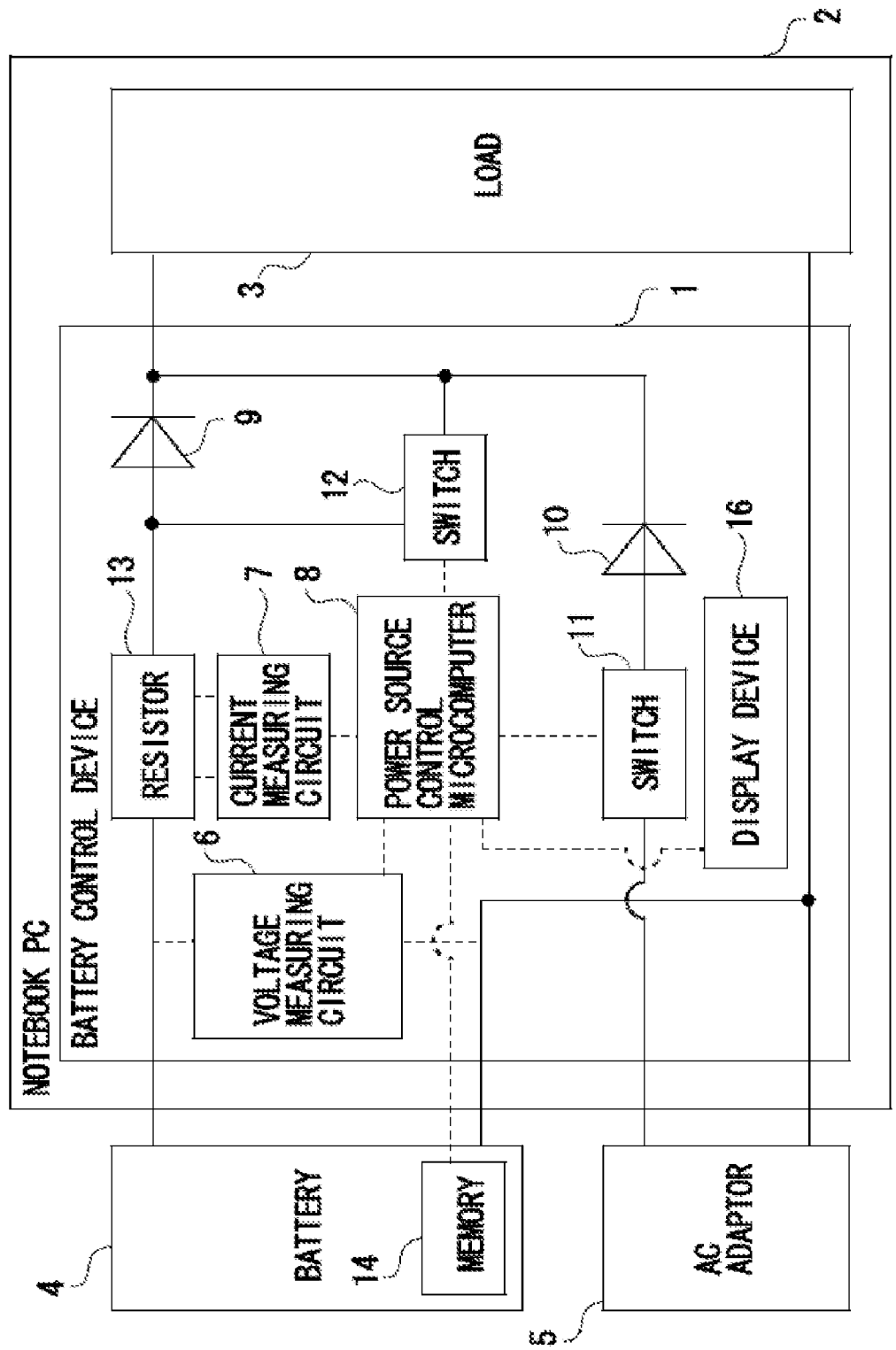
FIG. 9 is a diagram of a configuration of the notebook type personal computer mounted with the battery control device.

FIG. 9 shows a diagram of a configuration of the notebook PC 2 mounted with the battery control device 1 according to a third modified example. As illustrated in FIG. 9, a display device 16 is provided in the battery control device 1. The power source control microcomputer 8 sends information on the charging/discharging count of the battery 4 to the display device 16. The display device 16 receives the information on the charging/discharging count of the battery 4 from the power source control microcomputer 8, and displays the charging/discharging count of the battery 4. The battery control device 1 according to the third modified example enables the user to recognize a degree of deterioration of the battery 4 by checking the charging/discharging count displayed on the display device 16.

Moreover, the power source control microcomputer 8 may send the information on the charging/discharging count of the battery 4 to a display device (unillustrated) included in the notebook PC 2. The display device included in the notebook PC receives the information on the charging/discharging count of the battery 4 from the power source control microcomputer 8, and displays the charging/discharging count of the battery 4. The battery control device 1 according to the third modified example enables the user to recognize the degree of deterioration of the battery 4 by checking the charging/discharging count displayed on the display device included in the notebook PC.

<Computer Readable Recording Medium>

It is possible to record a program which causes a computer to implement any of the functions described above on a computer readable recording medium. By causing the computer to read in the program from the recording medium and execute it, the function thereof can be provided. The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM (Read Only Memory).

What is claimed is:

1. A battery control device comprising:
a voltage measuring unit to measure a voltage of a battery;
a current measuring unit to measure an electric current of the battery; and
a power source control unit to calculate an open-circuit voltage of the battery based on the voltage of the battery and the electric current of the battery, and to calculate a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage,
wherein the power source control unit calculates a charge quantity ratio of the battery by subtracting a battery residual quantity ratio of the battery at charge ending time from a battery residual quantity ratio of the battery at charge starting time, calculates a value obtained by multiplying the charge quantity ratio by a correction coefficient as a charging-discharging count of the battery, and integrates the charging-discharging count each time the charging-discharging count is calculated.

2. A battery control device according to claim 1, wherein the power source control unit calculates a charge quantity ratio of the battery by subtracting a battery residual quantity ratio of the battery at discharge ending time from a battery residual quantity ratio of the battery at discharge starting time, calculates a value obtained by multiplying the charge quantity ratio by a correction coefficient as a charging-discharging count of the battery, and integrates the charging-discharging count each time the charging-discharging count is calculated.

3. A battery control device according to claim 1, wherein the power source control unit, if the charging-discharging count exceeds a predetermined value, calculates the predetermined value as the charging-discharging count and, if the charging-discharging count does not exceed the predetermined value, calculates, as the charging-discharging count, a value obtained by multiplying the charge quantity ratio by the correction coefficient.

4. A battery control device according to claim 1, wherein the correction coefficient is a value calculated based on a discharge capacity of the battery that decreases due to deterioration of the battery.

5. A battery control method comprising:
measuring a voltage of a battery;
measuring an electric current of the battery;
calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage; and
calculating a charge quantity ratio of the battery by subtracting a battery residual quantity ratio of the battery at charge ending time from a battery residual quantity ratio of the battery at charge starting time, calculating a value obtained by multiplying the charge quantity ratio by a correction coefficient as a charging-discharging count of the battery, and integrating the charging-discharging count each time the charging-discharging count is calculated.

6. A battery control method according to claim 5, further comprising calculating a charge quantity ratio of the battery by subtracting a battery residual quantity ratio of the battery at discharge ending time from a battery residual quantity ratio of the battery at discharge starting time, calculating a value obtained by multiplying the charge quantity ratio by a correction coefficient as a charging-discharging count of the battery, and integrating the charging-discharging count each time the charging-discharging count is calculated.

7. A battery control method according to claim 5, further comprising if the charging-discharging count exceeds a predetermined value, calculating the predetermined value as the charging-discharging count and, if the charging-discharging count does not exceed the predetermined value, calculating, as the charging-discharging count, a value obtained by multiplying the charge quantity ratio by the correction coefficient.

8. A battery control method according to claim 5, wherein the correction coefficient is a value calculated based on a discharge capacity of the battery that decreases due to deterioration of the battery.

9. A battery pack comprising:
   a voltage measuring unit to measure a voltage of a battery;
   a current measuring unit to measure an electric current of the battery; and
   a power source control unit to calculate an open-circuit voltage of the battery based on the voltage of the battery and the electric current of the battery, and to calculate a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage,
   wherein the power source control unit calculates a charge quantity ratio of the battery by subtracting a battery residual quantity ratio of the battery at charge ending time from a battery residual quantity ratio of the battery at charge starting time, calculates a value obtained by the charge quantity ratio by a correction coefficient as a charging-discharging count of the battery, and integrates the charging-discharging count each time the charging-discharging count is calculated.

10. A battery pack according to claim 9, wherein the power source control unit calculates a charge quantity ratio of the battery by subtracting a battery residual quantity ratio of the battery at discharge ending time from a battery residual quantity ratio of the battery at discharge starting time, calculates a value obtained by the charge quantity ratio by a correction coefficient as a charging-discharging count of the battery, and integrates the charging-discharging count each time the charging-discharging count is calculated.

11. A battery pack according to claim 9, wherein the power source control unit, if the charging-discharging count exceeds a predetermined value, calculates the predetermined value as the charging-discharging count and, if the charging-discharging count does not exceed the predetermined value, calculates, as the charging-discharging count, a value obtained by multiplying the charge quantity ratio by the correction coefficient.

12. A battery pack according to claim 9, wherein the correction coefficient is a value calculated based on a discharge capacity of the battery that decreases due to deterioration of the battery.

13. A battery pack according to claim 9, wherein the battery pack is constructed attachably and detachably to and from an electronic apparatus including a load and, when attached to the electronic apparatus, supplies driving electric power to the load from the battery.

14. An electronic apparatus driving a load by electric power supplied from a battery, comprising:
    a voltage measuring unit to measure a voltage of a battery;
    a current measuring unit to measure an electric current of the battery; and
    a power source control unit to calculate an open-circuit voltage of the battery based on the voltage of the battery and the electric current of the battery, and to calculate a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage,
    wherein the power source control unit calculates a charge quantity ratio of the battery by subtracting a battery residual quantity ratio of the battery at charge ending time from a battery residual quantity ratio of the battery at charge starting time, calculates a value obtained by the charge quantity ratio by a correction coefficient as a charging-discharging count of the battery, and integrates the charging-discharging count each time the charging-discharging count is calculated.

15. An electronic apparatus according to claim 14, wherein the power source control unit calculates a charge quantity ratio of the battery by subtracting a battery residual quantity ratio of the battery at discharge ending time from a battery residual quantity ratio of the battery at discharge starting time, calculates a value obtained by multiplying the charge quantity ratio by a correction coefficient as a charging-discharging count of the battery, and integrates the charging-discharging count each time the charging-discharging count is calculated.

16. An electronic apparatus according to claim 14, wherein the power source control unit, if the charging-discharging count exceeds a predetermined value, calculates the predetermined value as the charging-discharging count and, if the charging-discharging count does not exceed the predetermined value, calculates, as the charging-discharging count, a value obtained by multiplying the charge quantity ratio by the correction coefficient.

17. An electronic apparatus according to claim 14, wherein the correction coefficient is a value calculated based on a discharge capacity of the battery that decreases due to deterioration of the battery.

18. An electronic apparatus according to claim 14, wherein the battery includes a recording unit, and
    the power source control unit records the integrated charging-discharging count in the recording unit.

19. An electronic apparatus according to claim 18, wherein the battery is an attachable-detachable battery.

20. An electronic apparatus according to claim 14, wherein the power source control unit, when supplied with the electric power from an external power source, executes control of supplying the electric power to the load.

21. An electronic apparatus according to claim 20, wherein the power source control unit executes the control of charging the battery with the electric power from the external power source.

22. A computer readable storage medium storing a battery control program, making a computer perform the functions of a battery control device by executing:
    measuring a voltage of a battery;
    measuring an electric current of the battery;
    calculating an open-circuit voltage of the battery based on the voltage of the battery and the electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage; and
    calculating a charge quantity ratio of the battery by subtracting a battery residual quantity ratio at charge ending time from a battery residual quantity ratio of the battery at charge starting time, calculating a value obtained by multiplying the charge quantity ratio by a correction coefficient as a charging-discharging count of the battery, and integrating the charging-discharging count each time the charging-discharging count is calculated.

23. A computer readable storage medium storing a battery control program according to claim 22, further making the battery control device execute calculating a charge quantity ratio of the battery by subtracting a battery residual quantity ratio of the battery at discharge ending time from a battery residual quantity ratio of the battery at discharge starting time, calculating a value obtained by multiplying the charge quantity ratio by a correction coefficient as a charging-discharging count of the battery, and integrating the charging-discharging count each time the charging-discharging count is calculated.

24. A computer readable storage medium storing a battery control program according to claim 22, further making the battery control device execute, if the charging-discharging count exceeds a predetermined value, calculating the predetermined value as the charging-discharging count and, if the charging-discharging count does not exceed the predetermined value, calculating, as the charging-discharging count, a value obtained by multiplying the charge quantity ratio by the correction coefficient.

25. A computer readable storage medium storing a battery control program according to claim 22, wherein the correction coefficient is a value calculated based on a discharge capacity of the battery that decreases due to deterioration of the battery.

26. A control circuit of a battery control device including a voltage measuring unit to measure a voltage of a battery and a current measuring unit to measure an electric current of the battery, and controlling a charging-discharging count of the battery, the control circuit comprising:

a power source control unit to calculate an open-circuit voltage of the battery based on the measured voltage of the battery and the measured electric current of the battery, and calculating a battery residual quantity ratio of the battery by use of relative information representing a relationship between the battery residual quantity ratio defined as a value representing a ratio of a residual quantity of the battery to a total capacity of the battery and the open-circuit voltage, and by use of the calculated open-circuit voltage, wherein the power source control unit calculates a charge quantity ratio of the battery by subtracting a battery residual quantity ratio of the battery at charge ending time from a battery residual quantity ratio of the battery at charge starting time, calculates a value obtained by multiplying the charge quantity ratio by a correction coefficient as a charging-discharging count of the battery, and integrates the charging-discharging count each time the charging-discharging count is calculated.

27. A control circuit according to claim 26, wherein the power source control unit calculates a charge quantity ratio of the battery by subtracting a battery residual quantity ratio of the battery at discharge ending time from a battery residual quantity ratio of the battery at discharge starting time, calculates a value obtained by multiplying the charge quantity ratio by a correction coefficient as a charging-discharging count of the battery, and integrates the charging-discharging count each time the charging-discharging count is calculated.

28. A control circuit according to claim 26, wherein the power source control unit, if the charging-discharging count exceeds a predetermined value, calculates the predetermined value as the charging-discharging count and, if the charging-discharging count does not exceed the predetermined value, calculates, as the charging-discharging count, a value obtained by multiplying the charge quantity ratio by the correction coefficient.

29. A control circuit according to claim 26, wherein the correction coefficient is a value calculated based on a discharge capacity of the battery that decreases due to deterioration of the battery.

\* \* \* \* \*

UNITED STATES PATENT AND TRADEMARK OFFICE
CERTIFICATE OF CORRECTION

PATENT NO. : 7,693,671 B2
APPLICATION NO. : 11/858303
DATED : April 6, 2010
INVENTOR(S) : Masafumi Okumura et al.

It is certified that error appears in the above-identified patent and that said Letters Patent is hereby corrected as shown below:

Column 18, Line 66 Claim 7, after "comprising" insert --,--.

Column 19, Line 27 Claim 10, after "by" insert --multiplying--.

Column 19, Line 37 Claim 10, after "by" insert --multiplying--.

Column 20, Line 10 Claim 14, after "by" insert --multiplying--.

Signed and Sealed this

Thirteenth Day of July, 2010

David J. Kappos
*Director of the United States Patent and Trademark Office*